(12) United States Patent
Kang et al.

(10) Patent No.: US 9,705,036 B2
(45) Date of Patent: Jul. 11, 2017

(54) LIGHT EMITTING DEVICE AND LIGHT EMITTING DEVICE PACKAGE

(71) Applicant: LG INNOTEK CO., LTD., Seoul (KR)

(72) Inventors: Ki Man Kang, Seoul (KR); Jung Hun Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/009,562

(22) Filed: Jan. 28, 2016

(65) Prior Publication Data

US 2016/0225951 A1  Aug. 4, 2016

(30) Foreign Application Priority Data

Jan. 29, 2015 (KR) ........................ 10-2015-0014198

(51) Int. Cl.
| | | |
|---|---|---|
| *H01L 33/14* | (2010.01) | |
| *H01L 33/38* | (2010.01) | |
| *H01L 33/44* | (2010.01) | |
| *H01L 33/06* | (2010.01) | |
| *H01L 33/24* | (2010.01) | |
| *H01L 33/30* | (2010.01) | |
| *H01L 33/32* | (2010.01) | |

(52) U.S. Cl.
CPC ............ *H01L 33/145* (2013.01); *H01L 33/06* (2013.01); *H01L 33/24* (2013.01); *H01L 33/305* (2013.01); *H01L 33/325* (2013.01); *H01L 33/38* (2013.01); *H01L 33/44* (2013.01)

(58) Field of Classification Search
None
See application file for complete search history.

(56) References Cited

U.S. PATENT DOCUMENTS

| | | | |
|---|---|---|---|
| 2004/0159836 A1* | 8/2004 | Sugimoto | ......... H01L 21/28575 257/40 |
| 2010/0155752 A1 | 6/2010 | Lim et al. | |
| 2011/0095332 A1 | 4/2011 | Hwang et al. | |
| 2011/0133234 A1 | 6/2011 | Jeong | |
| 2012/0007121 A1 | 1/2012 | Lee et al. | |
| 2014/0264430 A1 | 9/2014 | Epler | |

FOREIGN PATENT DOCUMENTS

| | | |
|---|---|---|
| EP | 2207211 A1 | 7/2010 |
| EP | 2315276 A1 | 4/2011 |
| EP | 2330638 A1 | 6/2011 |
| EP | 2432036 A2 | 3/2012 |
| KR | 10-2005-0087025 A | 8/2005 |

\* cited by examiner

*Primary Examiner* — Angel Roman
*Assistant Examiner* — Kevin Quinto
(74) *Attorney, Agent, or Firm* — Birch, Stewart, Kolasch & Birch, LLP

(57) ABSTRACT

Disclosed are a light emitting device and a light emitting device package. The light emitting device includes a light emitting structure including a first conductive semiconductor layer, an active layer on the first conductive semiconductor layer and a second conductive semiconductor layer on the active layer; a first electrode pad on the first conductive semiconductor layer; a second electrode pad on the second conductive semiconductor layer; and a current blocking pattern overlapping an edge of at least one of the first and second electrode pads.

20 Claims, 6 Drawing Sheets

LIGHT EMITTING DEVICE AND LIGHT EMITTING DEVICE PACKAGE

CROSS-REFERENCE TO RELATED APPLICATIONS

The present application claims priority under 35 U.S.C. 119 to Korean Patent Application No. 10-2015-0014198 filed on Jan. 29, 2015, which is hereby incorporated by reference in its entirety.

BACKGROUND

The embodiment relates to a light emitting device and a light emitting device package.

A light emitting device (LED) includes a p-n junction diode having a characteristic of converting electric energy into light energy. The p-n junction diode can be formed by combining group III-V elements of the periodic table. The light emitting device can represent various colors by adjusting the compositional ratio of compound semiconductors.

A GaN-based light emitting device (LED) has been used in various applications such as a natural color LED display, an LED traffic signal device or a white color LED. In recent years, the luminous efficiency of a high-efficiency white color LED is superior to that of a conventional fluorescent lamp, so that it is expected in a general lighting field that the white color LED will replace the fluorescent lamp.

According to a light emitting device of the related art, an electrode may be damaged due to a current crowding phenomenon that concentrates current on the edges of electrodes by a high voltage such as static electricity. In particular, according to a light emitting device of the related art, the edges of the electrodes of an ultraviolet light emitting device using a high driving voltage may be damaged due to the current crowding phenomenon.

SUMMARY

The embodiment is to provide a light emitting device and a light emitting device package capable of improving reliability.

The embodiment is to provide a stable light emitting device and a stable light emitting device package.

According to an embodiment, there is provided a light emitting device which includes a light emitting structure including a first conductive semiconductor layer, an active layer on the first conductive semiconductor layer and a second conductive semiconductor layer on the active layer; a first electrode pad on the first conductive semiconductor layer; a second electrode pad on the second conductive semiconductor layer; and a current blocking pattern overlapping an edge of at least one of the first and second electrode pads.

A light emitting device package according to an embodiment may include the light emitting device.

According to one embodiment, the light emitting device may be prevented from being damaged due to the current crowding near the edges of the first and second electrode pads, so that the stability of the ultraviolet light emitting device, which emits light having an ultraviolet ray wavelength and has a high driving voltage, may be improved.

According to another embodiment, the first and second current blocking patterns are formed on the first and second conductive semiconductor layers, respectively, so that the light emitting device may be prevented from being damaged due to the current crowding near the edges of the first and second electrode pads. Thus, the stability of the ultraviolet light emitting device, which emits light having an ultraviolet ray wavelength and has a high driving voltage, may be improved.

According to the light emitting device of still another embodiment, the first current blocking pattern may be formed in the first conductive semiconductor layer and the second current blocking pattern may be formed in the second conductive semiconductor layer through an ion implantation scheme, so that the light emitting device may be prevented from being damaged due to the current crowding near the edges of the first and second electrode pads. Thus, the stability of the ultraviolet light emitting device, which emits light having an ultraviolet ray wavelength and has a high driving voltage, may be improved.

DETAILED DESCRIPTION OF THE EMBODIMENTS

Hereinafter, a light emitting device and a light emitting device package according to the embodiment will be described with reference to accompanying drawings. In the description of the embodiments, it will be understood that, when a layer (or film), an area, a pattern, or a structure is referred to as being "on" or "under" another substrate, another layer (or film), another area, another pad, or another pattern, it can be "directly" or "indirectly" over the other substrate, layer (or film), area, pad, or pattern, or one or more intervening layers may also be present. Such a position of the layer has been described with reference to the drawings.

Figure 1:
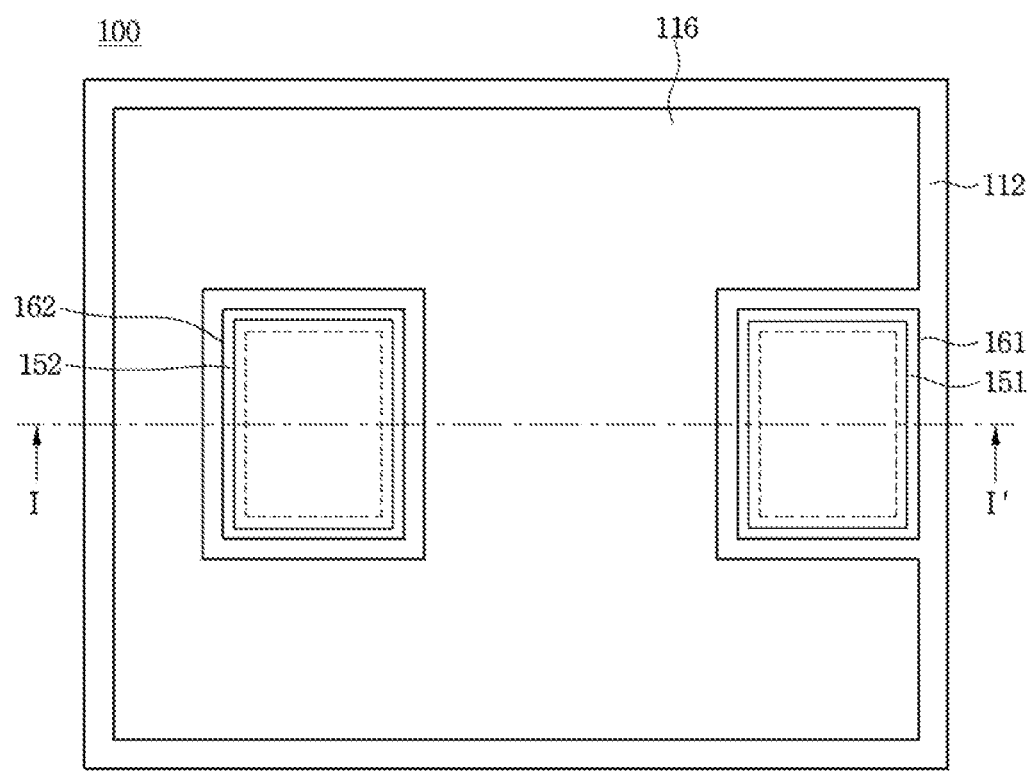
FIG. 1 is a plan view showing a light emitting device according to one embodiment.
Figure 2:
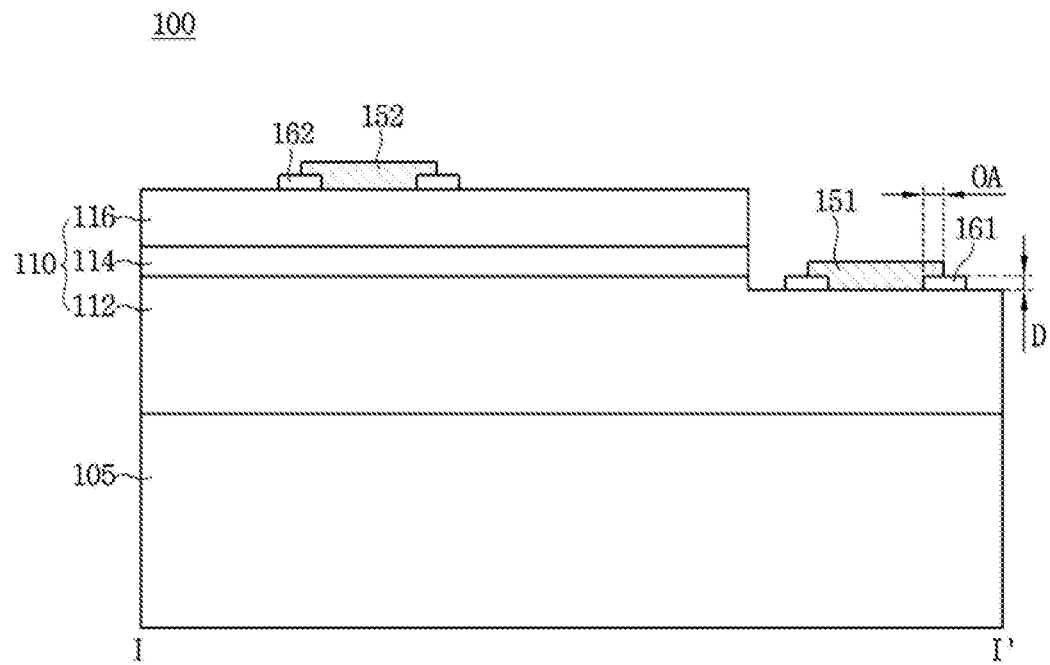
FIG. 2 is a sectional view taken along line I-I' of FIG. 1.

FIG. 1 is a plan view showing a light emitting device according to an embodiment. FIG. 2 is a sectional view taken along line I-I' of FIG. 1.

Referring to FIGS. 1 and 2, a light emitting device 100 according to an embodiment includes a substrate 105, a light emitting structure 110, the first and second electrode pads 151 and 152, and the first and second current blocking patterns 161 and 162.

The light emitting device 100 may emit light having an UV-C wavelength, that is, an ultraviolet ray wavelength in the range of 100 nm to 280 nm. The light emitting device 100 is not limited to the above, and may emit light having at least one of a visible-ray wavelength and infrared-ray wavelength.

The substrate 105, on which a GaN-based semiconductor layer may be grown, may include a transparent, insulating or conductive substrate. For example, the substrate 105 may be formed by using one of $Al_2O_3$, SiC, Si, GaAs, GaN, ZnO, Si, GaP, InP, Ge, $Ga_2O_3$, $LiGaO_3$, and quartz. A plurality of protrusions may be formed on a top surface of the substrate 105. The protrusions may be formed through an etching scheme or may be formed in a light extracting structure such as a separated roughness. The protrusion may be formed in a strip, hemispherical or dome shape.

Although not shown in the drawings, a buffer layer (not shown) may be further formed on the substrate 105. The buffer layer may attenuate the lattice mismatch between the substrate 105 and the nitride semiconductor layer and may work as a defect control layer.

The buffer layer may have a lattice constant between a lattice constant of the substrate 11 and a lattice constant of the nitride-based semiconductor layer. The buffer layer may be formed of oxide such as ZnO, but the embodiment is not limited thereto.

The light emitting structure 110 is disposed on the substrate 105. The light emitting structure 110 includes first and second conductive semiconductor layers 112 and 116 and an active layer 114.

The first conductive semiconductor layer 112 may be formed in a single layer or multiple layer structure. When the first conductive semiconductor layer 112 is an N-type semiconductor layer, the first conductive semiconductor layer 112 may be a group III-V compound semiconductor doped with a first conductive dopant. The first conductive dopant may include Si, Ge, Sn, Se or Te as an N-type dopant, but the embodiment is not limited thereto. The first conductive semiconductor layer 112 may include a semiconductor material having a compositional formula of $In_xAl_yGa_{1-x-y}N$ ($0 \leq x \leq 1$, $0 \leq y \leq 1$, $0 \leq x+y \leq 1$). The first conductive semiconductor layer 112 may include at least one of GaN, InN, AlN, InGaN, AlGaN, InAlGaN, AlInN, AlGaAs, InGaAs, AlInGaAs, GaP, AlGaP, InGaP, AlInGaP and InP.

The active layer 114 may be formed in at least one of a single quantum well structure, a multiple quantum well (MQW) structure, a quantum wire structure and a quantum dot structure. The active layer 114 may include a well layer and a barrier layer formed of GeN-based semiconductor layer.

For example, the active layer 114 may include at least one of InGaN/GaN, InGaN/InGaN, GaN/AlGaN, InAlGaN/GaN, GaAs/AlGaAs, InGaAs/AlGaAs, GaInP/AlGaInP, GaP/AlGaP and InGaP/AlGaP, but the embodiment is not limited thereto. The well layer may be formed of a material having a bandgap lower than that of the barrier layer.

The barrier layer and the well layer of the active layer 114 may be implemented as undoped layers which are not doped with impurity in order to improve the crystalline quality of the active layer 114, but impurity may be partially or entirely doped into the active area to decrease the forward voltage.

The second conductive semiconductor layer 116 may be disposed on the active layer 114 and formed in a single layer or multiple layer structure. When the second conductive semiconductor layer 116 is a P-type semiconductor layer, the second conductive semiconductor layer 116 may include group III-V compound semiconductor doped with a second conductive dopant. The second conductive dopant may include Mg, Zn, Ca, Sr or Ba as a P-type dopant, but the embodiment is not limited thereto. For example, the second conductive semiconductor layer 116 may be formed of a compound semiconductor such as GaN, AlN, AlGaN, InGaN, InN, InAlGaN, AlInN, AlGaAs, GaP, GaAs, GaAsP, AlGaInP or GaP.

The first electrode pad 151 may be disposed on the first conductive semiconductor layer 112.

The second electrode pad 152 may be disposed on the second conductive semiconductor layer 116.

The first and second electrode pads 151 and 152 may be formed of at least one selected from the group consisting of Ti, Ru, Rh, Ir, Mg, Zn, Al, In, Ta, Pd, Co, Ni, Si, Ge, Ag, Au and an alloy thereof.

The first current blocking pattern 161 may be disposed on the first conductive semiconductor layer 112. The first current blocking pattern 161 may be disposed under the first electrode pad 151. The first current blocking pattern 161 may overlap an edge of the first electrode pad 151. That is, the first current blocking pattern 161 may extend along the edge of the first electrode pad 151 without disconnection. The first current blocking pattern 161 may be disposed between the edge of the first electrode pad 151 and the first conductive semiconductor layer 112. A part of the first current blocking pattern 161 may have an area OA overlapping the first electrode pad 151 and the remaining part thereof may be exposed from the first electrode pad 151 to an outside. That is, the remaining part of the first current blocking pattern 161 may protrude outward beyond the edge of the first electrode pad 151. The first current blocking pattern 161 may make direct contact with a top surface of the first conductive semiconductor layer 112. The first current blocking pattern 161 may make direct contact with a bottom surface of the first electrode pad 151. For example, the overlapping area OA may be in the range of 5% to 10% of the entire area of the first electrode pad 151. The width of the sectional surface of the overlapping area OA may be in the range 5 μm to 15 μm. When the overlapping area OA may be less than 5% of the entire area of the first electrode pad 151 or the width of the sectional surface of the overlapping area OA may be less than 5 μm, it may be difficult to obtain a current blocking effect due to the misalignment between the first electrode pad 151 and the first current blocking pattern 161. In addition, when the overlapping area OA may exceed 15% of the entire area of the first electrode pad 151 or the width of the sectional surface thereof may exceed 5 μm, the current blocking area may be enlarged so that the light efficiency may be deteriorated. The first current blocking pattern 161 performs a function of blocking current concentrated on the edge of the first electrode pad 151. That is, the first current blocking pattern 161 may prevent current from being crowded into the edge of the first electrode pad 151. For example, the light emitting device 100 may include an ultraviolet ray light emitting device having a driving voltage higher than that of a conventional visible ray light emitting device, and thus, a current crowding phenomenon may occur in the area adjacent to the first electrode pad 151.

The first current blocking pattern 161 according to the embodiment may block the current concentrated on the edge of the first electrode pad 151. Thus, the light emitting device 100 according to the embodiment may prevent the edge of the first electrode pad 151 from being damaged due to the current crowding phenomenon so that the stability of the light emitting device 100 may be improved.

The second current blocking pattern 162 may be disposed on the second conductive semiconductor layer 116. The second current blocking pattern 162 may be disposed under the second electrode pad 151. The second current blocking pattern 162 may overlap an edge of the second electrode pad 152. That is, the second current blocking pattern 162 may extend along the edge of the second electrode pad 152 without disconnection. The second current blocking pattern 162 may be disposed between the edge of the second electrode pad 152 and the second conductive semiconductor layer 116. A part of the second current blocking pattern 162 may have an area OA overlapping the second electrode pad 152 and the remaining part thereof may be exposed from the second electrode pad 152 to an outside. That is, the remaining part of the second current blocking pattern 162 may protrude outward beyond the edge of the second electrode pad 152. The second current blocking pattern 162 may make direct contact with a top surface of the second conductive semiconductor layer 116. The second current blocking pattern 162 may make direct contact with a bottom surface of the second electrode pad 152. For example, the overlapping area OA may be in the range of 5% to 10% of the entire area of the second electrode pad 152. The width of the sectional surface of the overlapping area OA may be in the range 5 μm to 15 μm. When the overlapping area OA may be less than 5% of the entire area of the second electrode pad 152 or the width of the sectional surface of the overlapping area OA may be less than 5 μm, it may be difficult to obtain the current blocking effect due to the misalignment between the second electrode pad 152 and the second current blocking pattern 162. In addition, when the overlapping area OA may exceed 15% of the entire area of the second electrode pad 152 or the width of the sectional surface thereof may exceed 5 μm, the current blocking area may be enlarged so that the light efficiency may be deteriorated.

The second current blocking pattern 162 performs the function of blocking current concentrated on the edge of the second electrode pad 152. That is, the second current blocking pattern 161 may prevent current from being crowded into the edge of the second electrode pad 152. For example, the light emitting device 100 may include an ultraviolet ray light emitting device having a driving voltage higher than that of a conventional visible ray light emitting device, and thus, a current crowding phenomenon may occur in the area adjacent to the second electrode pad 152.

The second current blocking pattern 162 according to the embodiment may block the current concentrated on the edge of the second electrode pad 152. Thus, the light emitting device 100 according to the embodiment may prevent the edge of the second electrode pad 152 from being damaged due to the current crowding phenomenon so that the stability of the light emitting device 100 may be improved.

The first and second current blocking patterns 161 and 162 may be simultaneously formed and each may have a thickness in the range 100 nm to 300 nm.

Although the light emitting device 100 including all the first and second current blocking patterns 161 and 162 according to the embodiment has been described, the embodiment is not limited thereto and thus, the light emitting device 100 may include only the first or second current blocking pattern 161 or 162.

According to the light emitting device 100 of the embodiment, although the part of the first current blocking pattern 161 protruding outward beyond the edge of the first electrode pad 151 and the part of the second current blocking pattern 162 protruding outward beyond the edge of the second electrode pad 152 have been described, the embodiment is not limited thereto and the edges of the first and second current blocking patterns 161 and 162 may be disposed in parallel with the edges of the first and second electrode pads 151 and 152, respectively. That is, the whole of the first current blocking pattern 161 may overlap the first electrode pad 151 and the whole of the second current blocking pattern 162 may overlap the second electrode pad 152.

The light emitting device 100 according to the embodiment may be prevented from being damaged due to the current crowding near the edges of the first and second electrode pads 151 and 152, so that the stability of the ultraviolet ray light emitting device emitting light having an ultraviolet ray wavelength may be improved.

FIGS. 3 to 6 are views illustrating a method of manufacturing a light emitting device according to the embodiment.

Figure 3:
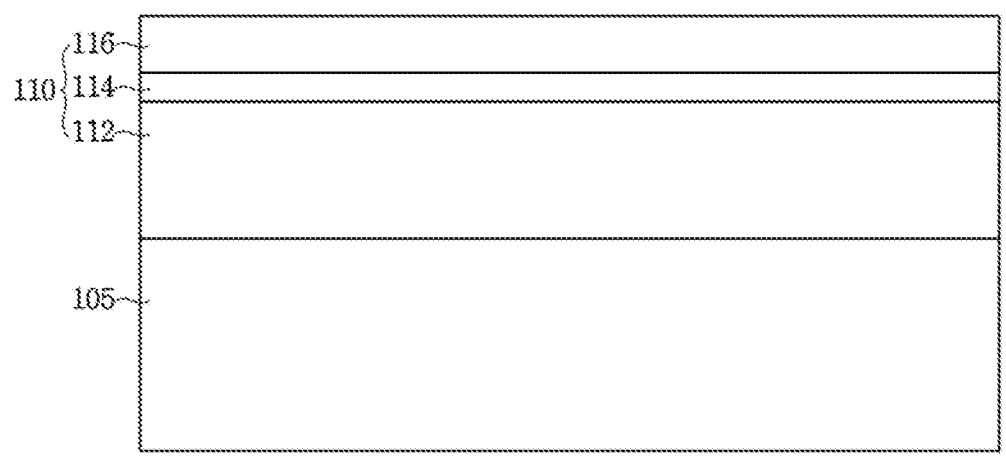
FIGS. 3 to 6 are views illustrating a method of manufacturing a light emitting device according to the embodiment.

Referring to FIG. 3, the light emitting device according to an embodiment includes a semiconductor structure 110 on a substrate 100.

The substrate 105 may be formed of a material having superior thermal conductivity and may be a conductive substrate or an insulating substrate. For example, the substrate 105 may include at least one of GaAs, $Al_2O_3$, SiC, Si, GaN, ZnO, GaP, InP, Ge and $Ga_2O_3$. A concave-convex structure P may be formed on the substrate 105, but the embodiment is not limited thereto. Impurities may be removed from the surface of the substrate 105 through wet cleaning.

A buffer layer (not shown) may be formed on the substrate 105. The buffer layer may relieve the lattice mismatch between a material of the light emitting structure 110 and the substrate 105. The buffer layer may be formed of group III-V compound semiconductor, for example at least one of GaN, InN, AlN, InGaN, AlGaN, InAlGaN and AlInN. An undoped semiconductor layer (not shown) may be formed on the buffer layer, but the embodiment is not limited thereto.

The light emitting structure 110 including the first and second conductive semiconductor layers 112 and 116 and the active layer 114 may be formed on the substrate 105 or the buffer layer.

The first conductive semiconductor layer 112 may be formed of a semiconductor compound, such as group III-V or group II-VI compound semiconductor, and doped with the first conductive dopant. When the first conductive semiconductor layer 112 is an N-type semiconductor layer, the first conductive dopant may be an N-type dopant, such as Si, Ge, Sn, Se or Te, but the embodiment is not limited thereto.

The first conductive semiconductor layer 112 may include a semiconductor material having a compositional formula of $In_xAl_yGa_{1-x-y}P$ ($0 \leq x \leq 1$, $0 \leq y \leq 1$, $0 \leq x+y \leq 1$) or $In_xAl_yGa_{1-x-y}N$ ($0 \leq x \leq 1$, $0 \leq y \leq 1$, $0 \leq x+y \leq 1$).

The first conductive semiconductor layer 112 may be formed of at least one of AlGaP, InGaP, AlInGaP, InP, GaN, InN, AlN, InGaN, AlGaN, InAlGaN, AlInN, AlGaAs, InGaAs, AlInGaAs and GaP.

The first conductive semiconductor layer 112 may be formed through a chemical deposition vapor (CDV) scheme, a molecular beam epitaxy (MBE) scheme, a sputtering scheme, or a hydride vapor phase epitaxy (HVPE) scheme, but the embodiment is not limited thereto.

Electrons injected through the first conductive semiconductor layer 112 are combined with holes injected through the second conductive semiconductor layer 116 at the active layer 114, so the active layer 114 emits light having the energy which is determined according to a typical energy band of a material constituting the active layer 114 (light emitting layer).

The active layer 114 may include at least one of a single quantum well structure, a multi quantum well (MQW) structure, a quantum wire structure and a quantum dot structure.

The active layer 114 may include a structure of well layer/barrier layer. The active layer 114 may include at least one of GaInP/AlGaInP, GaP/AlGaP, InGaP/AlGaP, InGaN/GaN, InGaN/InGaN, GaN/AlGaN, InAlGaN/GaN, GaAs/AlGaAs and InGaAs/AlGaAs, but the embodiment is not limited thereto. The well layer may be formed of a material having a bandgap lower than that of the barrier layer.

The second conductive semiconductor layer 116 may be formed of a semiconductor compound, such as group III-V or group II-VI compound semiconductor, and doped with the second conductive dopant. For example, the second conductive semiconductor layer 116 may include a semiconductor material having a compositional formula of $In_xAl_yGa_{1-x-y}P$ ($0 \le x \le 1$, $0 \le y \le 1$, $0 \le x+y \le 1$) or $In_xAl_yGa_{1-x-y}N$ ($0 \le x \le 1$, $0 \le x+y \le 1$). When the second conductive semiconductor layer 116 is a P-type semiconductor layer, the second conductive dopant may be a P-type dopant such as Mg, Zn, Ca, Sr or Ba.

Although the first conductive semiconductor layer 112 may be illustrated as an N-type semiconductor layer and the second conductive semiconductor layer 116 may be illustrated as a P-type semiconductor layer in the embodiment, the embodiment is not limited thereto. In addition, in the light emitting structure 110, a semiconductor layer having polarity opposite to that of the second conductive semiconductor layer 116, for instance, an N-type semiconductor layer (not shown) may be formed on the second conductive semiconductor layer 116. Thus, the light emitting structure 110 may have one of an N-P junction structure, a P-N junction structure, an N-P-N junction structure and a P-N-P junction structure.

Figure 4:
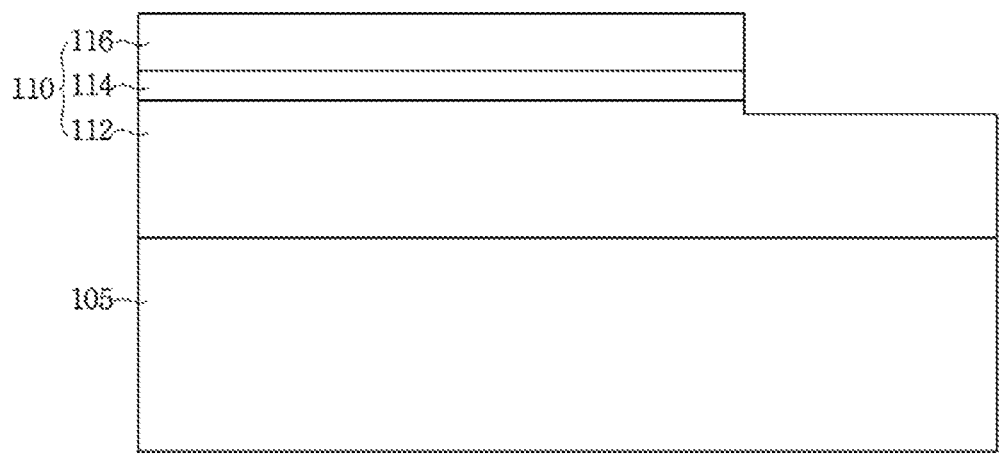

Referring to FIG. 4, the active layer 114 and the first and second conductive semiconductor layers 112 and 116 may be partially removed to expose the first conductive semiconductor layer 112. In this case, the process may be performed through a wet etching scheme or a dry etching scheme, but the embodiment is not limited thereto.

Figure 5:
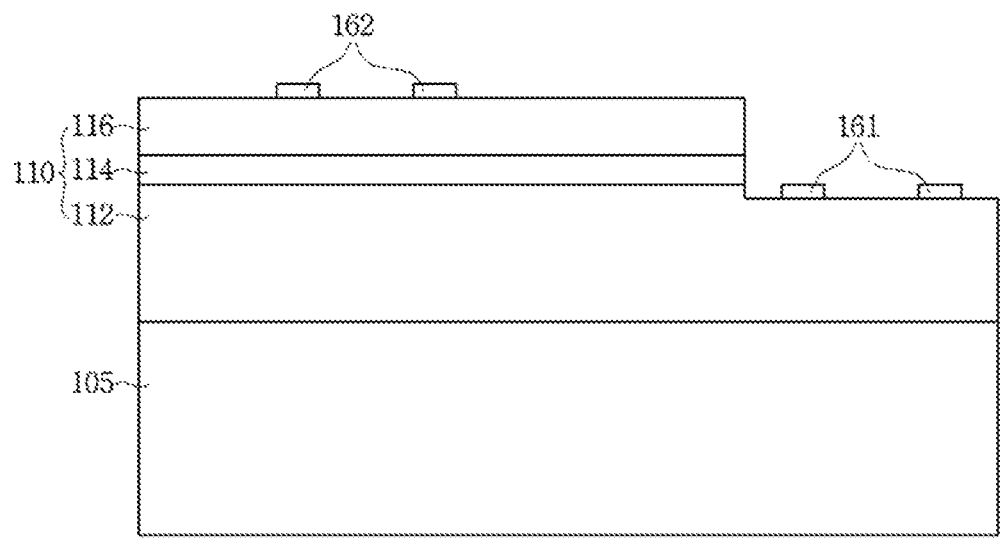

Referring to FIG. 5, the first current blocking pattern 161 may be formed on the exposed first conductive semiconductor layer 112 and the second current blocking pattern 162 may be formed on the second conductive semiconductor layer 116.

The first and second current blocking patterns 161 and 162 may be formed through an etching process using photoresist, but the embodiment is not limited thereto.

The first and second current blocking patterns 161 and 162 may be implemented by using oxide or nitride. For example, the current blocking layer 160 may be formed of at least one selected from the group consisting of $SiO_2$, SiNX, $Si_xO_y$, $Si_xN_y$, $SiO_xN_y$, $Al_2O_3$, $TiO_2$ and AlN, but the embodiment is not limited thereto.

The first and second current blocking patterns 161 and 162 may be formed in a ring type without disconnection.

Figure 6:
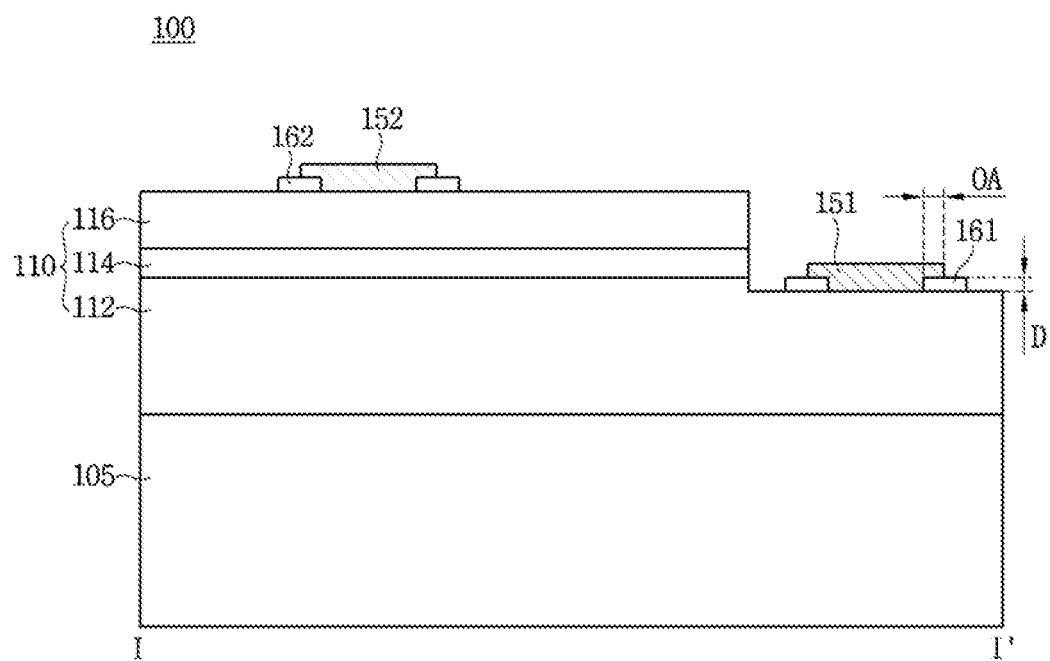

Referring to FIG. 6, the first electrode pad 151 may be disposed on the exposed first conductive semiconductor layer 112 and the second electrode pad 152 may be formed on the second conductive semiconductor layer 116.

The first electrode pad 151 may be formed in the compartment formed by the first current blocking pattern 161. The edge of the first electrode pad 151 may have the area OA overlapping the first current blocking pattern 161 and may be disposed in parallel with the edge of the first current blocking pattern 161.

The second electrode pad 152 may be formed in the compartment formed by the second current blocking pattern 162. The edge of the second electrode pad 152 may have the area OA overlapping the second current blocking pattern 162 and may be disposed in parallel with the edge of the second current blocking pattern 162.

The first and second electrode pads 151 and 152 may be formed of at least one of Ti, Cr, Ni, Al, Pt, Au, W and Mo, but the embodiment is not limited thereto.

The light emitting device 100 according to the embodiment may be prevented from being damaged due to the current crowding near the edges of the first and second electrode pads 151 and 152, so that the stability of the ultraviolet ray light emitting device emitting light having an ultraviolet ray wavelength may be improved.

Figure 7:
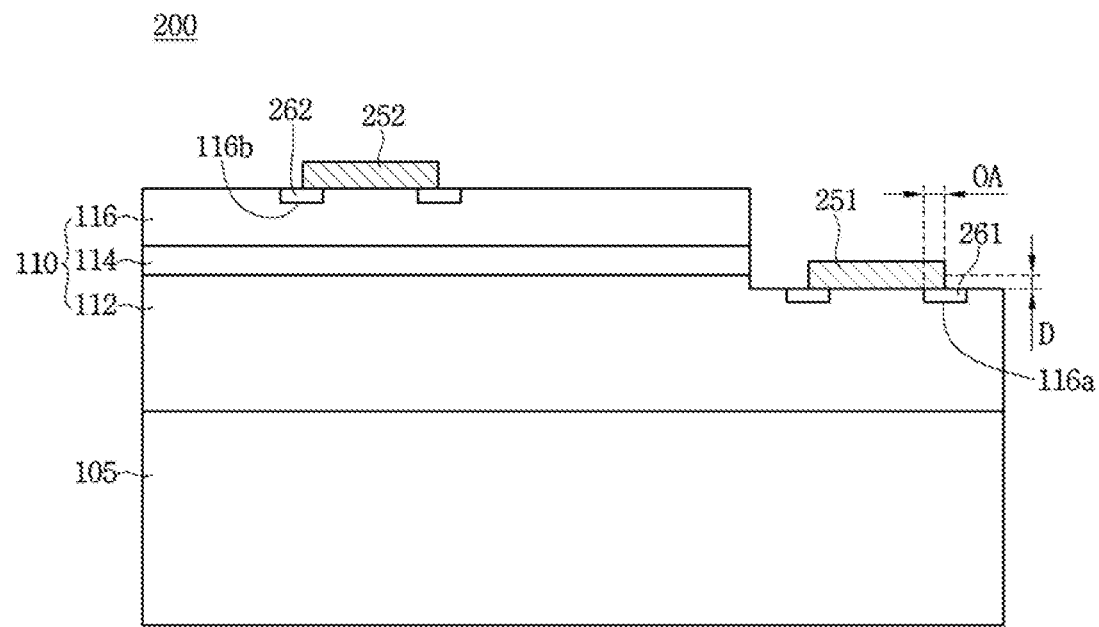
FIG. 7 is a sectional view showing a light emitting device according to another embodiment.

FIG. 7 is a sectional view showing a light emitting device according to another embodiment.

Another embodiment may employ the technical properties of the embodiment of FIGS. 1 to 6.

Referring to FIG. 7, since the configuration of the light emitting device 200 according to another embodiment is the same as that of the light emitting device 100 according to the embodiment of FIG. 1 except for the first and second current blocking patterns 261 and 262 and the first and second electrode pads 251 and 252, the same references will be assigned to the same elements and the details thereof will be omitted. In the following description, the main features of another embodiment will be focused.

The light emitting structure 110 is disposed on the substrate 105. The light emitting structure 110 includes the first and second conductive semiconductor layers 112 and 116 and the active layer 114.

The first conductive semiconductor layer 112 includes a first containing groove 116a. The first containing groove 116a may be formed in a ring type without disconnection.

The second conductive semiconductor layer 116 includes a second containing groove 116b. The second containing groove 116b may be formed in a ring type without disconnection.

The first current blocking pattern 261 may be formed in the first containing groove 116a. Top surfaces of the first current blocking pattern 261 and the first conductive semiconductor layer 112 may be disposed on the same plane.

The second current blocking pattern 262 may be formed in the second containing groove 116b. Top surfaces of the second current blocking pattern 262 and the second conductive semiconductor layer 116 may be disposed on the same plane.

The first and second current blocking patterns 261 and 262 may be simultaneously formed and each may have a thickness D in the range 100 nm to 300 nm. The first and second current blocking patterns 261 and 262 may be implemented by using oxide or nitride. For example, the first and second current blocking layers 261 and 262 may be formed of at least one selected from the group consisting of $SiO_2$, SiNX, $Si_xO_y$, $Si_xN_y$, $SiO_xN_y$, $Al_2O_3$, $TiO_2$ and AlN, but the embodiment is not limited thereto.

According to another embodiment, the first and second current blocking patterns are formed on the first and second conductive semiconductor layers, respectively, so that the light emitting device may be prevented from being damaged due to the current crowding near the edges of the first and second electrode pads. Thus, according to the light emitting device 200 of another embodiment, the stability of the ultraviolet light emitting device, which emits light having an ultraviolet ray wavelength and has a high driving voltage, may be improved.

Figure 8:
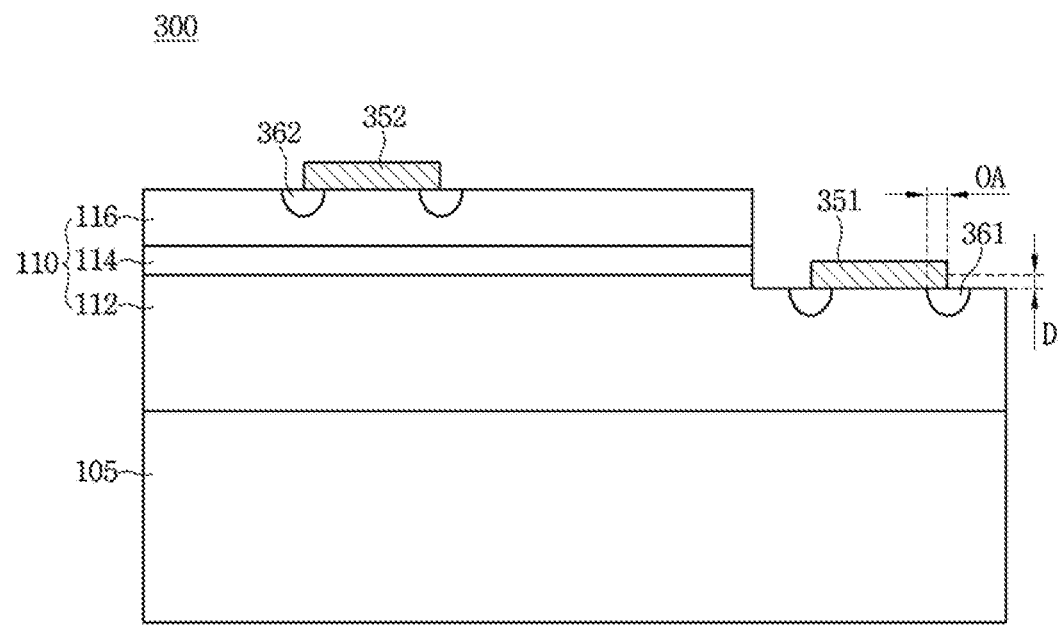
FIG. 8 is a sectional view showing a light emitting device according to still another embodiment

FIG. 8 is a sectional view showing a light emitting device according to still another embodiment.

Still another embodiment may employ the technical properties of the embodiment of FIGS. 1 to 6.

Referring to FIG. 8, since the configuration of the light emitting device 300 according to still another embodiment is the same as that of the light emitting device 100 according to the embodiment of FIG. 1 except for the first and second current blocking patterns 361 and 362 and the first and second electrode pads 351 and 352, the same references will be assigned to the same elements and the details thereof will be omitted. In the following description, the main features of still another embodiment will be focused.

The light emitting structure 110 is disposed on the substrate 105. The light emitting structure 110 includes the first and second conductive semiconductor layers 112 and 116 and the active layer 114.

The first current blocking pattern 361 may be formed in the first conductive semiconductor layer 112. The first current blocking pattern 361 may include a dopant different from a dopant of the first conductive semiconductor layer 112. For example, when the first conductive semiconductor layer 112 is an N-type semiconductor, the first current blocking pattern 361 may include Mg, Zn, Ca, Sr or Ba as a P-type dopant, but the embodiment is not limited thereto. Top surfaces of the first current blocking pattern 361 and the first conductive semiconductor layer 112 may be disposed on the same plane.

The second current blocking pattern 362 may be formed in the second conductive semiconductor layer 112. The second current blocking pattern 362 may include a dopant different from a dopant of the second conductive semiconductor layer 116. For example, when the second conductive semiconductor layer 116 is a P-type semiconductor, the second current blocking pattern 362 may include Si, Ge, Sn, Se or Te as a N-type dopant, but the embodiment is not limited thereto. Top surfaces of the second current blocking pattern 362 and the second conductive semiconductor layer 116 may be disposed on the same plane.

The first and second current blocking patterns 361 and 362 may be simultaneously formed and each may have a thickness in the range 100 nm to 300 nm.

According to the light emitting device 300 of still another embodiment, the first current blocking pattern 361 may be formed in the first conductive semiconductor layer 112 and the second current blocking pattern 362 may be formed in the second conductive semiconductor layer 116 through an ion implantation scheme, so that the light emitting device 300 may be prevented from being damaged due to the current crowding near the edges of the first and second electrode pads 351 and 352. Thus, the stability of the ultraviolet light emitting device, which emits light having an ultraviolet ray wavelength and has a high driving voltage, may be improved.

Figure 9:
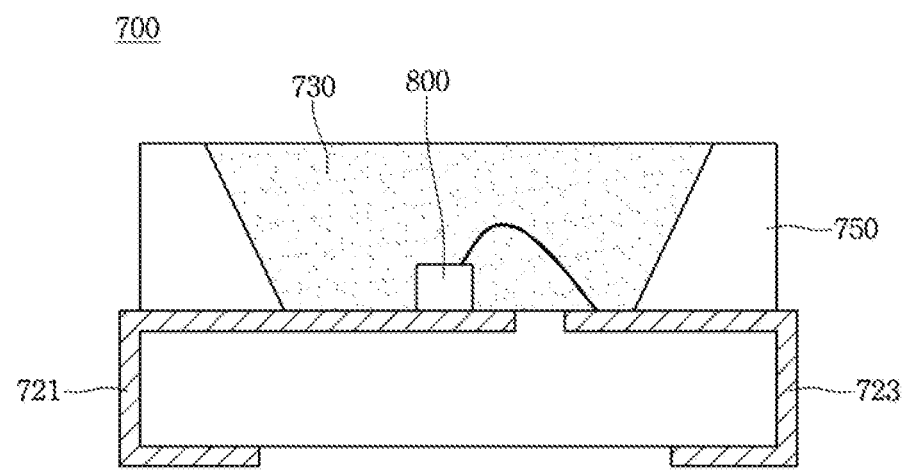
FIG. 9 is a sectional view showing a light emitting device package including a light emitting device according to an embodiment.

FIG. 9 is a sectional view showing a light emitting device package including a light emitting device according to an embodiment.

Referring to FIG. 9, the light emitting device package 700 includes a body 750, first and second lead electrodes 721 and 723, at least part of which is disposed on the body 750, a light emitting device 800 provided on the body 750 and electrically connected to the first and second lead electrodes 721 and 723, and a molding member 730 that surrounds the light emitting device 100 on the body 750.

The light emitting device 800 may employ the technical features of FIGS. 1 to 8.

The body 750 may include silicon, synthetic resin or metallic material.

The first and second lead electrodes 131 and 132 may be electrically isolated from each other and pass through the inside of the body 750. That is, parts of the first and second lead electrodes 721 and 723 may be disposed in a cavity and other parts may be disposed to an outside of the body 750.

Electric power may be supplied to the light emitting device 800 through the first and second lead electrodes 721 and 723 and the light generated from the light emitting device 800 may be reflected upon the first and second lead electrodes 721 and 723, so that the light efficiency may be improved and the heat generated from the light emitting device 800 may be discharged.

The light emitting device package 700 may be applied to the light unit. The light unit may include a structure in which a plurality of light emitting devices or light emitting packages is arrayed and may include a lamp, a signal lamp, a headlight of a vehicle and an electric sign board.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

What is claimed is:

1. A light emitting device comprising:
    a light emitting structure including a first conductive semiconductor layer, an active layer on the first conductive semiconductor layer and a second conductive semiconductor layer on the active layer;
    a first electrode pad on the first conductive semiconductor layer;
    a second electrode pad on the second conductive semiconductor layer; and
    a current blocking pattern overlapping an edge of at least one of the first and second electrode pads,
    wherein the current blocking pattern includes an overlapping area overlapping each of the first electrode pad and the second electrode pad, and
    wherein the overlapping area is in the range of 5 % to 10 % of the entire area of the first electrode pad or the second electrode pad.

2. The light emitting device of claim 1, wherein the current blocking pattern includes a first current blocking pattern under the first electrode pad and overlapping an edge of the first electrode pad, and a second current blocking pattern under the second electrode pad and overlapping an edge of the second electrode pad.

3. The light emitting device of claim 2, wherein the first current blocking pattern extends along the edge of the first electrode pad.

4. The light emitting device of claim 2, wherein the first current blocking pattern includes a part having an area overlapping the first electrode pad, and another part exposed from the first electrode pad to an outside.

5. The light emitting device of claim 2, wherein a part of the first current blocking pattern protrudes outward beyond the edge of the first electrode pad.

6. The light emitting device of claim 2, wherein the first current blocking pattern is disposed on the first conductive semiconductor layer and makes direct contact with the first conductive semiconductor layer.

7. The light emitting device of claim 2, wherein the first electrode pad makes direct contact with the first conductive semiconductor layer and the first current blocking pattern.

8. The light emitting device of claim 2, wherein the second current blocking pattern extends along the edge of the second electrode pad.

9. The light emitting device of claim 2, wherein the second current blocking pattern includes a part having an area overlapping the second electrode pad, and another part exposed from the second electrode pad to an outside.

10. The light emitting device of claim 2, wherein a part of the second current blocking pattern protrudes outward beyond the edge of the second electrode pad.

11. The light emitting device of claim 2, wherein the second current blocking pattern is disposed on the second conductive semiconductor layer and makes direct contact with the second conductive semiconductor layer.

12. The light emitting device of claim 2, wherein the second electrode pad makes direct contact with the second conductive semiconductor layer and the second current blocking pattern.

13. The light emitting device of claim 2, wherein the first conductive semiconductor layer includes a first containing groove containing the first current blocking pattern.

14. The light emitting device of claim 2, wherein the second conductive semiconductor layer includes a second containing groove containing the second current blocking pattern.

15. The light emitting device of claim 2, wherein the first current blocking pattern includes a dopant different from a dopant of the first conductive semiconductor layer, and the second current blocking pattern includes a dopant different from a dopant of the second conductive semiconductor layer.

16. The light emitting device of claim 1, wherein an outer edge of the current blocking pattern is disposed in parallel with outer edges of the first and second electrode pads.

17. The light emitting device of claim 1, wherein the light emitting structure has a deep ultraviolet wavelength.

18. A light emitting device package comprising:
a body; and
a light emitting device on the body, wherein the light emitting device comprises a light emitting structure including a first conductive semiconductor layer, an active layer on the first conductive semiconductor layer and a second conductive semiconductor layer on the active layer; a first electrode pad on the first conductive semiconductor layer; a second electrode pad on the second conductive semiconductor layer; and a current blocking pattern overlapping an edge of at least one of the first and second electrode pads,
wherein the current blocking pattern comprises a thickness in the range 100 nm to 300 nm,
wherein the current blocking pattern includes a first current blocking pattern under the first electrode pad, and
wherein the first conductive semiconductor layer includes a first containing groove containing the first current blocking pattern.

19. The light emitting device of claim 18, wherein the current blocking pattern includes a second current blocking pattern under the second electrode pad and overlapping an edge of the second electrode pad.

20. The light emitting device of claim 19,
wherein the second conductive semiconductor layer includes a second containing groove containing the second current blocking pattern.

* * * * *